United States Patent [19]
Lee

[11] Patent Number: 6,091,661
[45] Date of Patent: Jul. 18, 2000

[54] DATA ACCESS DEVICE FOR DRAM

[75] Inventor: Ihl-Ho Lee, Seoul, Rep. of Korea

[73] Assignee: LG Semicon Co., Ltd., Cheongju, Rep. of Korea

[21] Appl. No.: 08/928,218

[22] Filed: Sep. 12, 1997

[30] Foreign Application Priority Data

Dec. 28, 1996 [KR] Rep. of Korea ...................... 96-75725

[51] Int. Cl.[7] ................................ G11C 8/00; G11C 7/00
[52] U.S. Cl. ................................ 365/230.06; 365/189.08; 365/203
[58] Field of Search ..................................... 365/205, 208, 365/189.06, 230.06, 203, 149, 156, 189.01, 189.07, 189.08, 189.11, 190, 207; 711/105

[56] References Cited

U.S. PATENT DOCUMENTS

| | | | |
|---|---|---|---|
| 5,274,598 | 12/1993 | Fujii et al. ............................... | 365/205 |
| 5,392,242 | 2/1995 | Koike ................................... | 365/189.03 |
| 5,574,681 | 11/1996 | Foss et al. .............................. | 365/149 |
| 5,631,865 | 5/1997 | Iwase et al. ........................ | 365/189.01 |

*Primary Examiner*—Eddie P. Chan
*Assistant Examiner*—Denise Tran

[57] ABSTRACT

The data access device of a dynamic random access memory includes a plurality of bit line sensing amplifiers, decoders, and column sensing amplifiers. The plurality of bit line sensing amplifiers amplify a data signal and inverted data signal applied to a bit line and inverted bit line, respectively. The plurality of decoders each receive an inverted pulse signal and an associated code signal. Each decoder generates an enable signal based on the inverted pulse signal and the associated code signal. Each decoder includes a first and second NMOS transistor. Each of the column sensing amplifiers is associated with one of the decoders and one of the bit line sensing amplifiers, and each of the column sensing amplifiers selectively loads the data signal and inverted data signal of the associated bit line sensing amplifier on a first and second data bus, respectively, based on the enable signal from the associated decoder. Each column sensing amplifier includes a third and fourth NMOS transistor. A data amplifier connected to the first and second data buses amplifies the data signal and the inverted data signal loaded thereon.

18 Claims, 3 Drawing Sheets

DATA ACCESS DEVICE FOR DRAM

BACKGROUND OF THE INVENTION

1. Field of the Invention

The present invention relates to a data access device for a DRAM and, more particularly, to an access device having a reduced layout and increased accessing speed.

2. Discussion of Related Art

In general, during the sensing operation of a DRAM, cell data is transmitted to a bit line after a word line is actuated by a signal generated by a row decoder. The cell data transmitted to the bit line is then sensed by a sensing amplifier. The output ports of the sensing amplifiers are commonly connected to a data bus, and an amplifying array for outputting data is connected to an end of the data bus. FIGS. 1 and 2 illustrate two conventional data accessing devices using this technique.

As illustrated in FIG. 1, a conventional data access device of a DRAM includes first to nth bit line sensing amplifiers BS1–BSn for amplifying a signal applied to a bit line which controls a column of a memory matrix; first to nth decoders Y1–Yn for receiving first to nth code signals YC–YCn, respectively, and a pulse signal YP, and for generating a selection output according to those two signal inputs; a plurality of column sensing amplifiers CS1 through CSn for connecting the output signals of the first to nth sensing amplifiers BS1 to BSn (namely, the data output from a memory cell) with first and second data buses DBa and DBb according to the state of the selection output signals from the first to nth decoders Y1 to Yn; and a data amplifier DS, connected to the ends of the first and second data buses DBa and DBb, amplifying the data loaded on the first and second data buses DBa and DBb.

Each of the first to nth decoders Y1 to Yn has the same structure. For example, the first decoder Y1 includes a NAND gate 10 for receiving an externally input first code signal YC1 and a pulse signal YP, and performs a NAND logic operation thereon. Each of the first to nth decoders Y1–Yn receives the pulse signal YP, but a different code signal.

A CMOS inverter 20 receives and inverts the output of the NAND gate 10. The CMOS inverter 20 includes a PMOS transistor MP and an NMOS transistor MN. The drain and source of the NMOS transistor MN are connected to the drain of the PMOS transistor MP and ground, respectively. The source of the PMOS transistor MP is connected to a reference voltage VINT, and the gates of the PMOS and NMOS transistors MP and MN are connected to the output of the NAND gate 10. The connection between the drains of the PMOS and NMOS transistors MP and MN serves as the output for the first decoder Y1.

Each of the column sensing amplifiers CS1 to CSn has the same structure. The first column sensing amplifier CS1, for example, includes first and second NMOS transistors N1 and N2, having their gates connected to the output of the first decoder Y1, and third and fourth NMOS transistors N3 and N4, having their gates connected to bit and inverse bit lines BO NMOS transistors N3 and N4, having their gates connected to bit and inverse bit lines BO and BbO of the first bit line sensing amplifiers BSa1. The drains of the first and second NMOS transistors N1 and N2 are connected to the first and second data buses DBa and DBb, respectively. The sources of the first and second NMOS transistors N1 and N2 are connected to the drains of the third and fourth NMOS transistors N3 and N4, respectively, and the sources of the third and fourth NMOS transistors N3 and N4 are connected to ground.

The thus-structured conventional device operates as follows. When the first decoder Y1 outputs a signal having a logic high state based on the pulse input YP and the first code signal YC1, the second to nth decoders Y2–Yn output signals having a logic low state. The second to nth code signals YC1–YCn are generated such that only one of the first to nth decoders Y1–Yn outputs a logic high signal. Namely, only one of the first to nth code signals YC1–YCn has a logic high state, and the corresponding one of the first to nth decoders Y1–Yn will output a logic high signal when the pulse signal YP achieves a logic high state.

Particularly, the operational procedure of the first decoder Y1 is as follows. If the first decoder Y1 is not selected initially, the first code signal YC1 maintains the logic low state so that the output signal of the NAND gate 10 is logic high. Therefore, the output signal of the inverter 20 is logic low. Even if the pulse signal YP is logic high, as long as the first code signal YC1 is logic low, the output signal of the NAND gate 10 is logic high and the output of the inverter 20 is logic low. Thereafter, if the pulse signal YP and the first code YC1 are both logic high, the output of the NAND gate 10 goes low. The output of the inverter 20 thus becomes logic high. Because the output signal of the first decoder Y1 and N2 of the first column sensing amplifier CS1 turn on, and the voltages of the bit and inverse bit lines BO and BbO read out of the cell are transmitted to the first and second data buses DBa and DBb.

Specifically, one of the bit and inverse bit lines BO and BbO will have a logic high state such that a corresponding one of the third and fourth NMOS transistors N3 and N4 will turn on. As a result, the one of the first and second data buses DBa and DBb connected to the one of the third and fourth NMOS transistors N3 and N4 which is on will be pulled to ground (i.e., logic low). The other of the first and second data buses DBa and DBb remains at a pre-charged logic high state. The data amplifier DS amplifies the voltage difference on the first and second data buses DB and DBb.

FIG. 2 illustrates another conventional data access device. The conventional data access device of FIG. 2 is the same as the data access device of FIG. 1, except for the structure of the column sensing amplifiers. Therefore, only the structure and operation of first to mth column sensing amplifiers CS1–CSm will be described. Each of the first to mth column sensing amplifiers CS1–CSm is identically structured.

As shown in FIG. 2, the first column sensing amplifier CS1 includes first and second NMOS transistors N0 and N1 having their gates connected to the output of the first decoder Y1. The sources of the first and second NMOS transistors N0 and N1 are connected to the first and second data buses DBa and DBb, respectively, while the drains of the first and second NMOS transistors N0 and N1 are connected to the bit and inverse bit lines BO and BbO, respectively.

When the output of the first decoder Y1 is logic high, the first and second NMOS transistors N0 and N1 turn on such that the first and second data buses DBa and DBb assume the logic state of the bit and inverse bit lines BO and BbO, respectively.

The above-mentioned conventional devices have no specific operational problem. But, as DRAMS become more highly integrated, the size of a cell decreases; and therefore, the limitation of the bit line's width for reading out the cell's data also reduces. As a result, it gets more difficult to arrange the bit line sensing amplifier and the corresponding column sensing amplifier. In addition, when the voltage difference between the data bit and the inverted data bit on the first and second data buses DBa and DBb is great, the sensing operation is easily performed by the data amplifier DS, but, it takes too much time to equalize the voltages on the data buses after the sensing operation and in preparation for the next sensing operation. Therefore, the accessing speed of the entire memory is slow.

SUMMARY OF THE INVENTION

Accordingly, the present invention is directed to a data access device for DRAM that substantially obviates one or more of the problems due to limitations and disadvantages of the related art.

An object of the present invention is to provide a data access device of DRAM having a reduced layout.

Another object of the present invention is to provide a data access device for DRAM which enhances accessing speed.

These and other objects are achieved by providing a data access device of a dynamic random access memory comprising: a plurality of bit line sensing amplifiers for amplifying a data signal and inverted data signal applied to a bit line and inverted bit line, respectively, controlling a row of a memory matrix; a plurality of decoders, each decoder receiving an inverted pulse signal and an associated code signal, and each decoder generating an enable signal based on said inverted pulse signal and said associated code signal, and each decoder including, a first NMOS transistor having a first gate, first source, and first drain, said first gate receiving said associated code signal, said first source receiving said inverted pulse signal, and said first drain serving as an output of said decoder, and a second NMOS transistor having a second gate, second source, and second drain, said second gate receiving said inverted pulse signal, said second source connected to said first drain, and said second drain connected to a first predetermined positive voltage; a plurality of column sensing amplifiers, each column sensing amplifier associated with one of said decoders and one of said bit line sensing amplifiers, and each column sensing amplifier selectively loading said data signal and of said inverted data signal of said associated bit line sensing amplifier on a first and second data bus, respectively, based on said enable signal from said associated decoder; and a data amplifier connected to said first and second data buses for amplifying said data signal and said inverted data signal loaded thereon.

These and other objects are further achieved by providing a data access device of a dynamic random access memory comprising: a plurality of bit line sensing amplifiers for amplifying a data signal and inverted data signal applied to a bit line and inverted bit line, respectively, controlling a row of a memory matrix; a plurality of decoders, each decoder receiving an inverted pulse signal and an associated code signal, and each decoder generating an enable signal based on said inverted pulse signal and said associated code signal; a plurality of column sensing amplifiers, each column sensing amplifier associated with one of said decoders and one of said bit line sensing amplifiers, and each of column sensing amplifier selectively loading said data signal and said inverted data signal of said associated bit line sensing amplifier on a first and second data bus, respectively, based on said enable signal from said associated decoder, each column sensing amplifier including, a first NMOS transistor having a first gate, first source and first drain, said first gate receiving said data signal from said associated bit line sensing amplifier, said first source connected to said first data bus, and said first drain receiving said enable signal from said associated decoder, and a second NMOS transistor having a second gate, second source and second drain, said second gate receiving said inverted data signal from said associated bit line sensing amplifier, said second source connected to said second data bus, and said second drain receiving said enable signal from said associated decoder; and a data amplifier connected to said first and second data buses for amplifying said data signal and said inverted data signal loaded thereon.

These and other objects are still further achieved by providing a data access device of a dynamic random access memory comprising: a plurality of bit line sensing amplifiers for amplifying a data signal and inverted data signal applied to a bit line and inverted bit line, respectively, controlling a row of a memory matrix; a plurality of decoders, each decoder receiving an inverted pulse signal and an associated code signal, and each decoder generating an enable signal based on said inverted pulse signal and said associated code signal; a plurality of column sensing amplifiers, each column sensing amplifier associated with one of said decoders and one of said bit line sensing amplifiers, and each column sensing amplifier selectively loading said data signal and said inverted data signal of said associated bit line sensing amplifier on a first and second data bus, respectively, based on said enable signal from said associated decoder, said first and second data buses being pre-charged to a first positive voltage and said column sensing amplifiers preventing a voltage on said first and second buses from decreasing below a second positive voltage; and a data amplifier connected to said first and second data buses for amplifying said data signal and said inverted data signal loaded thereon.

Additional features and advantages of the invention will be set forth in the description which follows, and in part will be apparent from the description, or may be learned by practice of the invention. The objectives and other advantages of the invention will be realized and attained by the structure particularly pointed out in the written description and claims thereof as well as the appended drawings.

It is to be understood that both the foregoing general description and the following detailed description are exemplary and explanatory and are intended to provide further explanation of the invention as claimed.

BRIEF DESCRIPTION OF THE ATTACHED DRAWINGS

The accompanying drawings, which are included to provide a further understanding of the invention and are incorporated in and constitute a part of this specification, illustrate embodiments of the invention and together with the description serve to explain the principles of the invention.

DETAILED DESCRIPTION OF PREFERRED EMBODIMENT

Reference will now be made in detail to the preferred embodiments of the present invention, examples of which are illustrated in the accompanying drawings.

Figure 3:
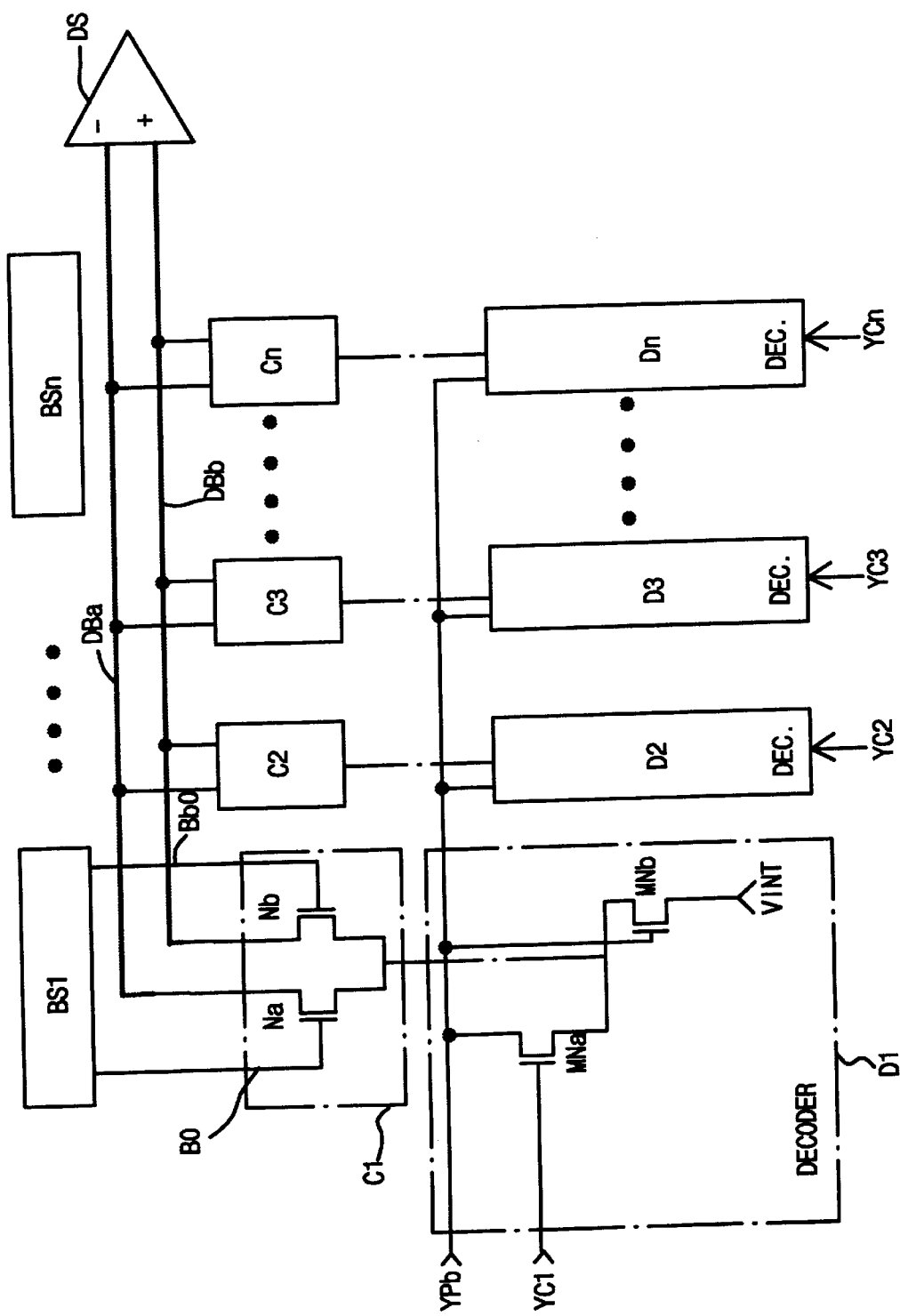
FIG. 3 is a circuit diagram of a data access device of DRAM according to the present invention.

FIG. 3 illustrates a circuit diagram of a data access device of DRAM according to the present invention. As shown in FIG. 3, the data access device includes first to nth bit line sensing amplifiers BS1–BSn for amplifying a signal applied to a bit line which controls a column of a memory matrix.

First to nth decoders D1–Dn receive the first to nth code signals YC1–YCn, respectively, and each receive an inverted pulse signal YPb. The first to nth decoders D1–Dn each generate a selection or enable output which is received by first to nth column sensing amplifiers C1–Cn, respectively. The first to nth column sensing amplifiers C1–Cn, based on the respective selection signals, alter the logic state of first and second data buses DBa and DBb in accordance with the logic state of the bit and inverse bit lines BO and BbO from the respective first to nth bit line sensing amplifiers BS1–PSn. A data amplifier DS amplifies the data loaded on the first and second data buses DBa and DBb. In their unaltered state, the first and second data buses DBa and DBb are pre-charged to a voltage equal to the logic high voltage of a predetermined positive voltage VINT minus the threshold voltage Vth of an NMOS transistor. The first to nth decoders D1–Dn are identically structured with respect to one another. Accordingly, the structure of the first to nth decoders D1–Dn will be described using the first decoder D1 as an example.

Figure 1:
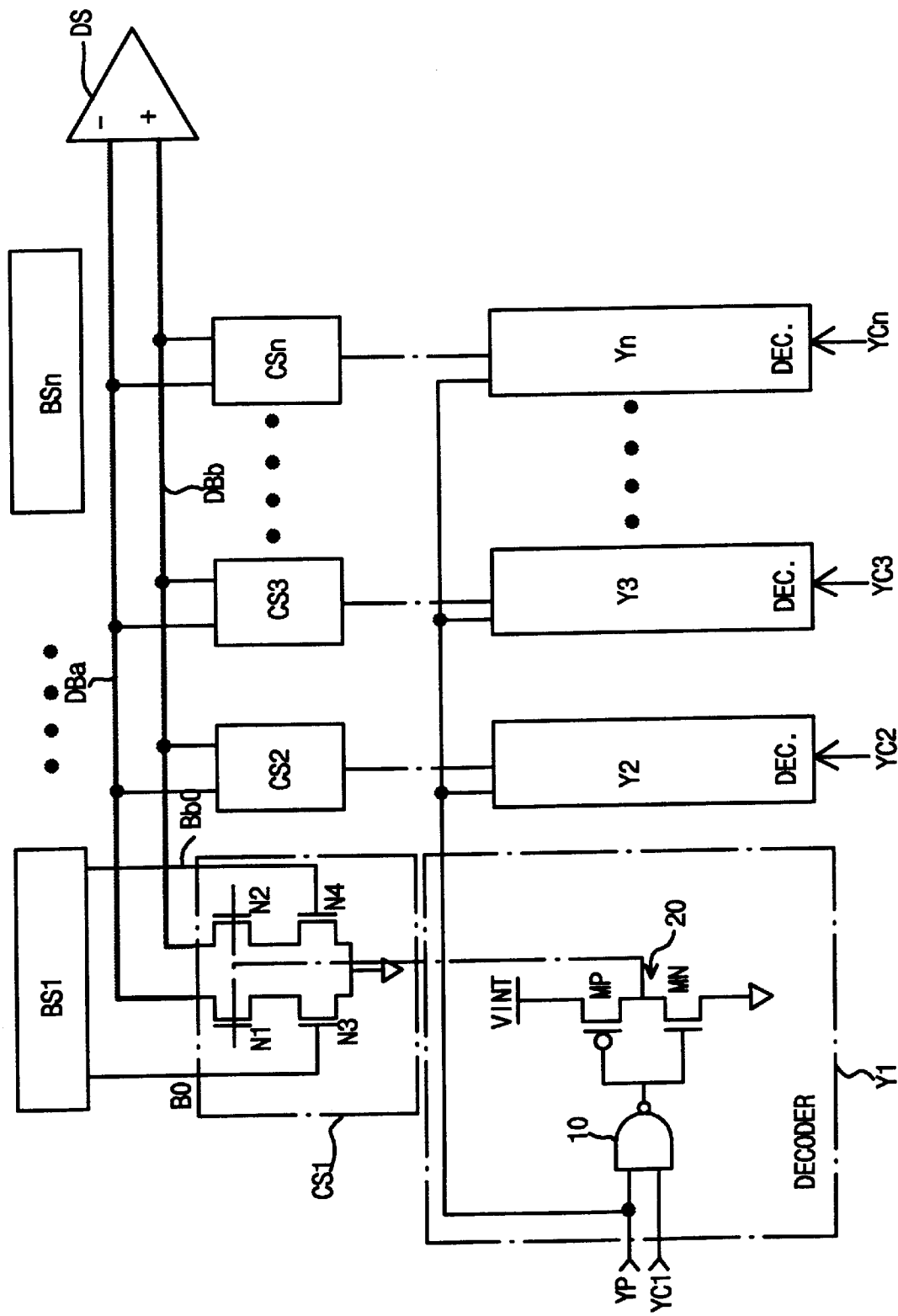
FIG. 1 is a circuit diagram of a conventional data access device of DRAM.
Figure 2:
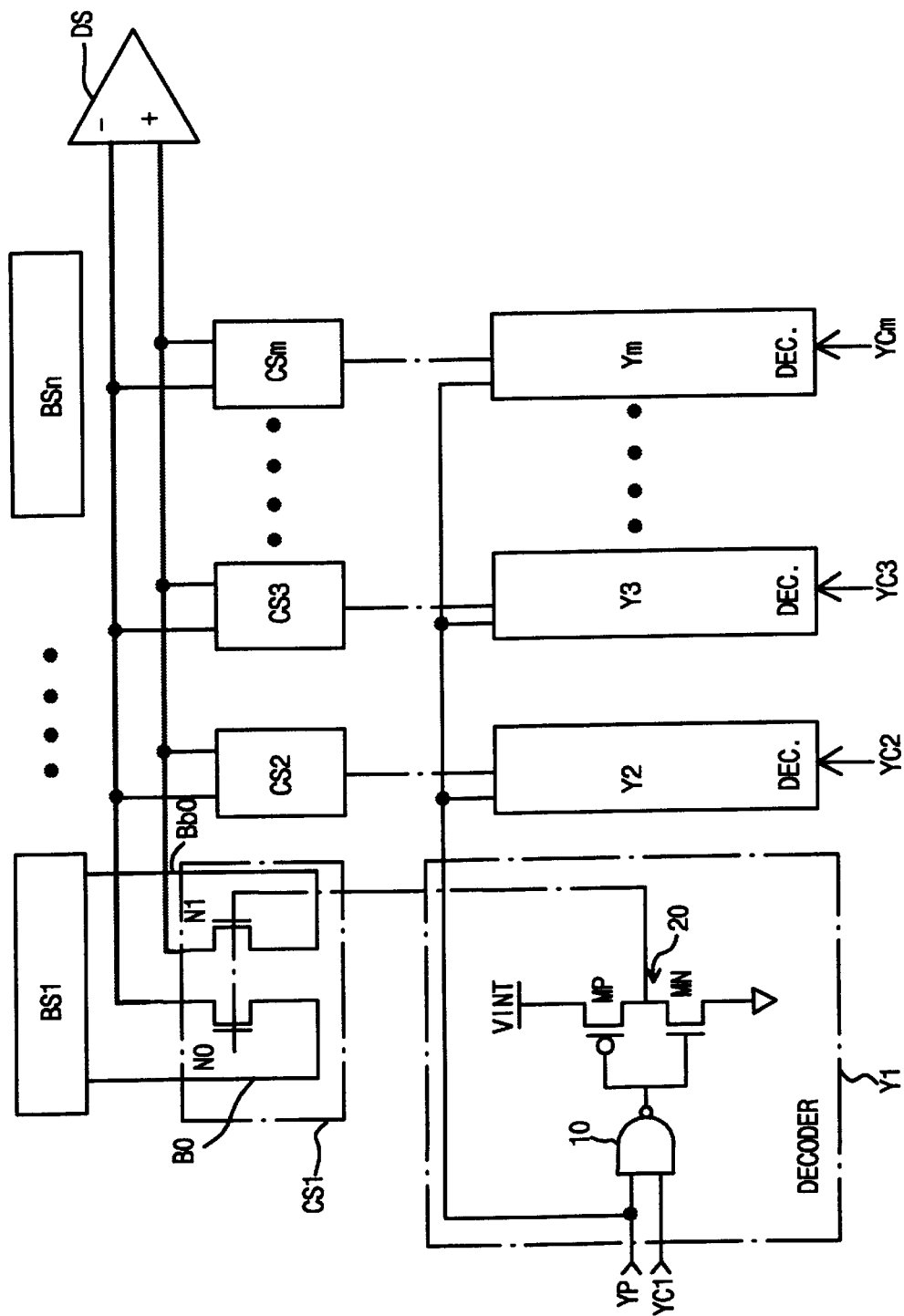
FIG. 2 is a circuit diagram of another conventional data access device of DRAM.

As shown in FIG. 3, the first decoder D1 includes a first NMOS transistor MNa and a second NMOS transistor MNb. The source of the first and NMOS transistor MNa and the gate of the second NMOS transistor MNb receive the inverted pulse signal YPb, which is an inverted version of the pulse signal YP received by the decoders in the conventional data access devices of FIGS. 1 and 2. The gate of the first NMOS transistor MNa receives the first code signal YC1. The drain of the first NMOS transistor MNa is connected to the source of the second NMOS transistor MNb, and the drain of the second NMOS transistor MNb receives the predetermined positive voltage VINT.

The first to nth column sensing amplifiers C1–Cn are also identically structured with respect to one another. Accordingly, the structure of the first to nth column sensing amplifiers C1–Cn will be described using the first column sensing amplifier C1 as an example.

As shown in FIG. 3, the first column sensing amplifier C1 includes third and fourth NMOS transistors Na and Nb. The gates of the third and fourth NMOS transistors Na and Nb are connected to the bit and inverse bit lines BO and BbO, respectively. The sources of the third and fourth NMOS transistors Na and Nb are connected to the first and second data buses DBa and DBb, respectively, while the drains of the first and second NMOS transistors Na and Nb are connected to the drain of the first NMOS transistor MNa in the first decoder D1.

In the thus-structured device, the signal for selecting the first to nth column sensing amplifiers C1–Cn is the voltage applied to the drain of the first NMOS transistor MNa in the first to nth decoders D1–Dn, respectively.

Next, the operation of the data access device according to the present invention shown in FIG. 3 will be described. The operation will be described using the first decoder D1 and the first column sensing amplifier C1 as examples. The inverted pulse signal YPb is input to the source of the first NMOS transistor MNa and the gate of the second NMOS transistor MNb. The first code signal YC1 is input to the gate of the first NMOS transistor MNa. Therefore, when the first code signal YC1 is at the logic low state, initially, the first NMOS transistor MNa is turned off. If the inverted pulse signal YPb is at the logic high state, the second NMOS transistor MNb is turned on so that the predetermined positive voltage VINT at the drain of the second NMOS transistor MNb is applied to the source thereof and the drain of the first NMOS transistor MNa. Here, the voltage at the source of the second NMOS transistor MNb does not equal the predetermined positive voltage VINT at the drain because the voltage is reduced by the threshold voltage Vth of an NMOS transistor (i.e., the second NMOS transistor MNb).

The voltage (VINT—Vth) at the source of the second NMOS transistor MNb is applied to the common drain of third and fourth NMOS transistors Na and Nb in the first column sensing amplifier C1. The first and second data buses DBa and DBb connected to the third and fourth NMOS transistors Na and Nb are pre-charged by a logic high voltage which equals VINT-Vth. Consequently, the drain and source of the third and fourth NMOS transistors Na and Nb receive the same potential, and the third and fourth NMOS transistors Na and Nb do not conduct regardless of the logic state of the signals on the bit and inverse bit lines BO and BbO of the first bit line sensing amplifier BS1.

When the first code signal YC1 goes high, the first NMOS transistors MNa turns on such that both the first and second NMOS transistors MNa and MNb in the first decoder D1 are on, and the voltage applied to the source of the second NMOS transistor MNb is maintained at the same voltage state. Thereafter, if the inverted pulse signal YPb goes low, the second NMOS transistor MNb turns off. Consequently, the voltage applied to the source of the second NMOS transistor MNb, namely, the voltage applied to the drain of the first NMOS transistor MNa becomes the voltage applied to the source of the first NMOS transistor MNa. Here, the voltage applied to the source of the first NMOS transistor MNa is logic low because the inverted pulse signal YPB is logic low.

Accordingly, because a logic low voltage is applied to the common drain of the third and fourth NMOS transistors Na and Nb of the first column sensing amplifier C1, the third and fourth NMOS transistors Na and Nb will now conduct according to the state of the bit and inverse bit lines BO and BbO of the first bit line sensing amplifier BS1.

Because the bit and inverse bit lines BO and BbO have opposite logic states, only one of the third and fourth NMOS transistors Na and Nb will conduct. The one of the first and second data lines DBa and DBb connected to the conducting third or fourth NMOS transistor Na or Nb gets pulled down towards the logic low state because the drain of the third and fourth transistors Na and Nb receives a logic low voltage from the drain of first NMOS transistor MNa. The logic state of the bit and inverse bit lines BO and BbO is thus inverted and transferred to the first and second data buses DBa and Db. Therefore, the voltage difference or logic state difference between the bit and inverse bit lines BO and BbO is transferred to the first and second data buses DBa and DBb for detecting by the data amplifier DS.

For instance, if the bit line BO is logic high and, thus, the inverse bit line BbO is logic low, the third NMOS transistor Na will conduct, but not the fourth NMOS transistor Nb. As a result, the second data bus DBb remains charged at the logic high voltage of VINT-Vth. The first data bus DBa, however, gets pulled toward the logic low voltage at the drains of the third and fourth NMOS transistors Na and Nb. But, because of a clamping effect, discussed in detail below, performed by the second to nth column sensing amplifiers C2–Cn and the second to nth decoders D2–Dn, the voltage at the first data bus DBa only drops to about VINT-2Vth.

While the discussion above pertained to the first decoder D1 and the first column sensing amplifier C1, the second to nth decoders D2–Dn and the second to nth column sensing amplifiers C2–Cn operate in the same manner. The first to nth code signals YC2–YCn are generated such that only one of the first to nth decoders D1–Dn will output a logic low voltage at a time. Consequently, only one of the first to nth column sensing amplifiers C1–Cn will transfer the logic state output by the corresponding one of the first to nth bit line sensing amplifiers BS1–BSn to the first and second data buses DBa and DBb.

The second to nth decoders D2–Dn, therefore, output a voltage of VINT-Vth while the first decoder D1 outputs the logic low voltage. The second to nth bit line sensing amplifiers BS1–BSn, however, still output bit and inverse bit data. As a result, if the voltage of the first data bus DBa is pulled down to logic low and the voltage drops below VINT-2Vth, the voltage difference between the source and drain of the third and fourth NMOS transistor Na and Nb in the second to nth column sensing amplifiers C2–Cn exceeds the threshold voltage Vth of an NMOS transistor. This causes the ones of the third and fourth NMOS transistors Na and Nb in the second to nth column sensing amplifiers C2–Cn receiving logic high voltages at their gate to conduct. This clamping action causes the voltage on the first data line DBa to increase.

The clamping effect discussed above with respect to the first data bus DBa equally applies to the second data bus DBb, and occurs regardless of which of the first to nth decoders D1–Dn outputs the logic low voltage.

In contrast to the conventional data access devices, a large voltage difference does not occur between the first and second data buses DBa and DBb such that it takes less time to equalize the voltages on the first and second data buses DBa and DBb after a data sensing operation. Consequently, the data access device according to the present invention achieves a reduction in access time along with a layout having a reduced size.

It will be apparent to those skilled in the art that various modifications and variations can be made in the data access device for DRAM according to the present invention without departing from the spirit or scope of the invention. Thus, it is intended that the present invention cover the modifications and variations of this invention provided they come within the scope of the appended claims and their equivalents.

What is claimed is:

1. A data accessing device of a dynamic random access memory comprising:
    a plurality of bit line sensing amplifiers for amplifying a data signal and inverted data signal applied to a bit line and inverted bit line, respectively;
    a plurality of decoders, each decoder receiving an inverted pulse signal and an associated code signal, and each decoder generating an enable signal based on said inverted pulse signal and said associated code signal, and each decoder including,
    a first NMOS transistor having a first gate, first source and first drain, said first gate receiving said associated code signal, said first source receiving said inverted pulse signal, and said first drain serving as an output of said decoder, and
    a second NMOS transistor having a second gate, second source and second drain, said second gate receiving said inverted pulse signal, said second source connected to said first drain, and said second drain connected to a first predetermined positive voltage;
    a plurality of column sensing amplifiers, each column sensing amplifier associated with one of said decoders and one of said bit line sensing amplifiers, and each column sensing amplifier selectively loading said data signal and said inverted data signal of said associated bit line sensing amplifier on a first and second data bus, respectively, based on said enable signal from said associated decoder; and
    a data amplifier connected to said first and second data buses for amplifying said data signal and said inverted data signal loaded thereon.

2. The data access device of claim 1, wherein each column sensing amplifier comprises:
    a third NMOS transistor having a third gate, third source and third drain, said third gate receiving said data signal from said associated bit line sensing amplifier, said third source connected to said first data bus, and said third drain connected to said first drain; and
    a fourth NMOS transistor having a fourth gate, fourth source and fourth drain, said fourth gate receiving said inverted data signal from said associated bit line sensing amplifier, said fourth source connected to said second data bus, and said fourth drain connected to said first drain.

3. The data access device of claim 2, wherein:
    said first and second data buses are pre-charged to a second positive voltage; and
    said column sensing amplifiers prevent a voltage on said first and second data buses from decreasing below a third positive voltage.

4. The data access device of claim 3, wherein said decoders enable only one of said column sensing amplifiers at a time; and
    said column sensing amplifiers non-enabled by said decoders prevent said voltage on said first and second data buses from decreasing below said third positive voltage.

5. The data access device of claim 1, wherein said first and second data buses are pre-charged to a second positive voltage.

6. The data access device of claim 5, wherein said first positive voltage is greater than said second positive voltage, and said second positive voltage is substantially equal to a logic level high voltage.

7. The data access device of claim 1, wherein
    said first and second data buses are pre-charged to a second positive voltage; and
    said column sensing amplifiers prevent a voltage on said first and second data buses from decreasing below a third positive voltage.

8. The data access device of claim 7, wherein
    said decoders enable only one of said column sensing amplifiers at a time; and
    said column sensing amplifiers non-enabled by said decoders prevent said voltage on said first and second data buses from decreasing below said third positive voltage.

9. The data access device of claim 1, wherein said first positive voltage is greater than a logic level high voltage.

10. A data access device of a dynamic random access memory comprising:
    a plurality of bit line sensing amplifiers for amplifying a data signal and inverted data signal applied to a bit line and inverted bit line, respectively;
    a plurality of decoders, each decoder receiving an inverted pulse signal and an associated code signal, and each decoder generating an enable signal based on said inverted pulse signal and said associated code signal;

a plurality of column sensing amplifiers, each column sensing amplifier associated with one of said decoders and one of said bit line sensing amplifiers, and each column sensing amplifier selectively loading said data signal and said inverted data signal of said associated bit line sensing amplifier on a first and second data bus, respectively, based on said enable signal from said associated decoder, each column sensing amplifier including, a first NMOS transistor having a first gate, first source and first drain, said first gate receiving said data signal from said associated bit line sensing amplifier, said first source connected to said first data bus, and said first drain receiving said enable signal from said associated decoder, and a second NMOS transistor having a second gate, second source and second drain, said second gate receiving said inverted data signal from said associated bit line sensing amplifier, said second source connected to said second data bus, and said second drain receiving said enable signal from said associated decoder; and a data amplifier connected to said first and second data buses for amplifying said data signal and said inverted data signal loaded thereon.

11. The data access device of claim 10, wherein said first and second data buses are pre-charged to a first positive voltage.

12. The data access device of claim 10, wherein each of said decoders outputs a logic low voltage as said enable signal to cause said associated column sensing amplifier to load said data signal and said inverted data signal from said associated bit line sensing amplifier on said first and second buses, respectively.

13. The data access device of claim 10, wherein said column sensing amplifiers prevent a voltage on said first and second buses from decreasing below a first positive voltage.

14. The data access device of claim 13, wherein said decoders enable only one of said column sensing amplifiers at a time; and said column sensing amplifiers non-enabled by said decoders prevent said voltage on said first and second data buses from decreasing below said first positive voltage.

15. A data access device of a dynamic random access memory comprising:

a plurality of bit line sensing amplifiers for amplifying a data signal and inverted data signal applied to a bit line and inverted bit line, respectively;

a plurality of decoders, each decoder receiving an inverted pulse signal and an associated code signal, and each decoder generating an enable signal based on said inverted pulse signal and said associated code signal;

a plurality of column sensing amplifiers, each column sensing amplifier associated with one of said decoders and one of said bit line sensing amplifiers, and each column sensing amplifier selectively loading said data signal and said inverted data signal of said associated bit line sensing amplifier on a first and second data bus, respectively, based on said enable signal from said associated decoder, said first and second data buses being pre-charged to a first positive voltage and said column sensing amplifiers preventing a voltage on said first and second buses from decreasing below a second positive voltage; and a data amplifier connected to said first and second data buses for amplifying said data signal and said inverted data signal loaded thereon.

16. The data access device of claim 15, wherein said decoders enable only one of said column sensing amplifiers at a time; and said column sensing amplifiers non-enabled by said decoders prevent said voltage on said first and second data buses from decreasing below said second positive voltage.

17. The data access device of claim 15, wherein each decoder generates said enabling signal to have a predetermined voltage when said inverted pulse signal and said associated code signal indicate not to enable said associated column sensing amplifier; and at least one of said column sensing amplifiers prevents said first and second buses from decreasing below said second positive voltage based on said predetermined voltage received as said enabling signal from said associated decoder.

18. The data access device of claim 17, wherein said at least one column sensing amplifier compares said predetermined voltage to a first voltage on said first bus and a second voltage on second bus, increases said first voltage when a difference between said predetermined voltage and said first voltage exceeds a predetermined threshold, and increases said second voltage when a difference between said predetermined voltage and said second voltage exceeds said predetermined threshold.

* * * * *